United States Patent [19]

Danglot

[11] Patent Number: 5,063,478

[45] Date of Patent: Nov. 5, 1991

[54] ELECTRICAL OR ELECTRONIC CONTROL KEY PAD

[76] Inventor: Bernard Danglot, 12 allee des Bruyeres, 95250 Beauchamp, France

[21] Appl. No.: 460,964

[22] PCT Filed: Jun. 3, 1988

[86] PCT No.: PCT/FR88/00280

§ 371 Date: Apr. 3, 1990

§ 102(e) Date: Apr. 3, 1990

[87] PCT Pub. No.: WO89/12310

PCT Pub. Date: Dec. 14, 1989

[51] Int. Cl.$^5$ .......................... H05K 1/18; H05K 5/06

[52] U.S. Cl. .................................... 361/405; 361/395

[58] Field of Search ............... 335/205, 206, 207, 153; 361/395, 399, 405; 400/477, 479

[56] References Cited

U.S. PATENT DOCUMENTS

| | | | |
|---|---|---|---|
| 3,559,124 | 1/1971 | Posey | 335/205 |
| 3,609,524 | 9/1971 | Kazmer | 335/207 X |
| 3,713,056 | 1/1973 | Hosokawa | 335/206 |
| 3,750,062 | 7/1973 | Goto | 335/206 |
| 3,854,131 | 12/1974 | Vanderheiden et al. | 335/206 X |
| 4,336,529 | 6/1982 | Buan | 200/305 X |
| 4,380,704 | 4/1983 | Wisda | 335/206 X |

*Primary Examiner*—Leo P. Picard
*Assistant Examiner*—Michael W. Phillips
*Attorney, Agent, or Firm*—Armstrong, Nikaido, Marmelstein, Kubovcik & Murray

[57] ABSTRACT

Electrical or electronic control key pad comprising a case, a front cover panel (2) which, when closed, blocks the passage of the magnetic flux except in areas where openings (3) are provided for this purpose, a bulb (9), for example with blades and pins per opening and placed in the case parallel at the level of the front panel (2) to detect the flux passing through said opening (3), a printed circuit in the base of the case and to which the bulbs (9 to 18) are connected. A pin of each bulb is located under the corresponding opening, while the body of the bulb and the other pin are placed under the solid part of the front panel (2). Application to key pads placed behind a pane and controlled by means of a magnet.

9 Claims, 1 Drawing Sheet

ELECTRICAL OR ELECTRONIC CONTROL KEY PAD

BACKGROUND OF THE INVENTION

1. Field of the Invention

This invention relates to an electrical or electronic control key pad.

2. Description of the Relevant Art

French patent No. 83 19245, filed on Dec. 1, 1983, under the name of Mr. Bernard DANGLOT, describes a key pad which permits electrical control codes to be formed. It consists of a closed case containing a device having one or several bulbs with contact blades which are sensitive to a magnetic field. It is characterized in that the opening in the case is covered by a wall with openings, and whose solid part is made of a material which blocks the passage of the magnetic field. It is further characterized in that the blades of one bulb are arranged under each opening in this wall so as to be actuatable under the effect of a magnetic field which is induced by a movable magnet placed in front of the opening, exterior to the case.

Although it is completely satisfactory, the key pad described in the aforementioned patent cannot be used at will in any location due to its volume. The object of the present invention is to obviate this disadvantage by providing an ultrathin key pad and to improve its performance.

SUMMARY OF THE INVENTION

According to this invention, the electrical or electronic control key pad is composed of a case; and a front panel which when closed blocks the magnetic flux, except in the areas where openings are provided for this purpose; one bulb (with blades and pins) for each opening and placed in the case at the level of the front face in order to detect the flux passing through the opening. The control lay pad of this invention further includes a printed circuit in the base of the case and to which the pins of the bulb are connected. Only one of the pins of each bulb is located under the corresponding opening, while the body of the bulb and the other pin are disposed under the solid part of the front panel. The pin placed in front of the opening is curved around in a plane parallel to the front face. The flux generated by a magnet placed in front of the opening can only reach one of the pins of the bulb. The flux is then conducted to the blades in the bulb which are attracted to each other and thus, close the electric circuit. A cable runs either laterally or through the back face of the case to connect the bulbs to a decoder located at a distance. The openings in the panel can be placed in a continuous line parallel to, and a short distance from, the edge of the case. Preferably, the axis of each bulb extends substantially along the center of the panel and the center of one opening.

These and other features of the invention will be understood upon reading of the following description along with the drawings.

DETAILED DESCRIPTION OF THE PREFERRED EMBODIMENTS

Figure 1:
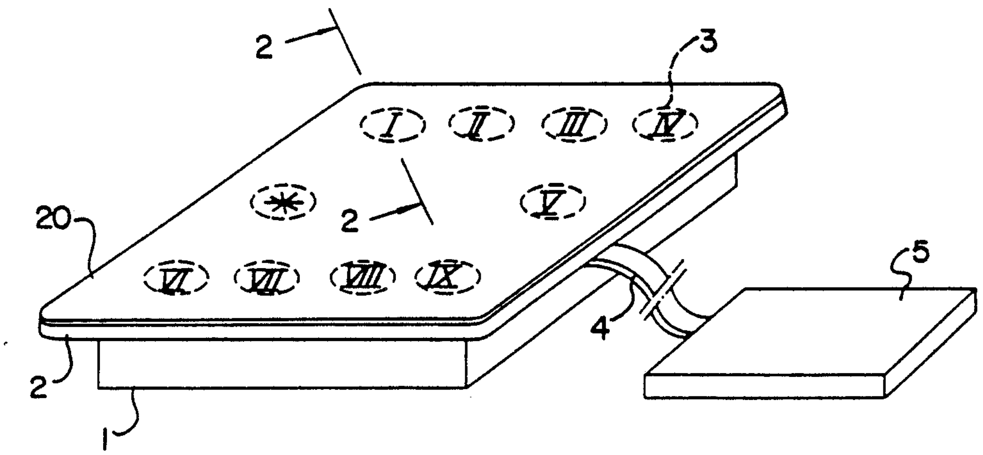
FIG. 1 is a front view of this invention in perspective without the protective pane.

The key pad includes a case 1 of a shallow depth, and closed by a front panel 2, with openings 3. A cable 4 runs from this case 1 connecting it to another case 5 which contains the coder/decoder device.

Figure 2:
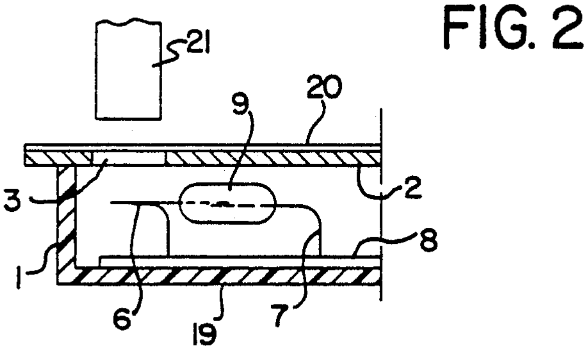
FIG. 2 is a partial section of this invention taken along the line II—II in FIG. 1.

In the embodiment shown, bulbs 9 to 18 are mounted inside the key pad. Each bulb has two blades which are sensitive to a magnetic field, each blade being extended by a pin 6 or 7, and emerging from the opposite ends of the bulb. FIG. 2 shows the body of the bulb 9 placed in parallel underneath the solid part of the front panel 2. Only the pin numbered 6 extends under the opening 3. Pin 6 is curved around and the free ends of the two pins are attached to a printed circuit. This circuit can be printed directly on the base 19 of the case 1 or on a special panel 8 attached to the base of the case.

A guide sheet 20 with numbers, letters or the like, is glued to the front face 2 over the openings 3. By placing a magnet 21 in front of a mark and an opening 3, a magnetic flux is applied to pin 6 (and exclusively to pin 6) which conducts this flux to the blade connected thereto so as to excite the circuit of the bulb 9. Once the magnet 21 is retracted, the circuit of the bulb is no longer excited.

Figure 3:
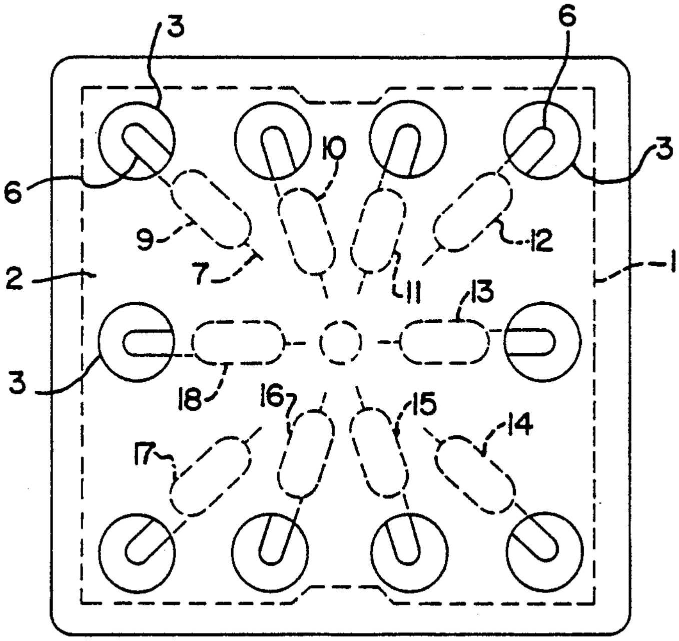
FIG. 3 is a top view of this invention, without the guide sheet.

FIG. 3 shows that the bulbs 9 to 18 are placed radially, each bulb being located on the axis running from the center of the case 1 to the center of one opening 3. Thus, the openings placed along the periphery are adequately spaced, notwithstanding the reduced space available within the case. All the non-curved pins 7 are directed toward the center of the case. Preferably, the cable 4 emerges from the case 1 through the center of the base of the case.

Since the bulbs are horizontally placed, it is readily apparent that the outer thickness of the case is very small, its inner depth being reduced, and the case is hardly thicker than the bulb itself.

According to another embodiment of the invention, the key pad is tightly sealed and can be immersed. For this purpose, the openings 3 of the front panel are filled with a resin (or another substance) enabling the magnetic field to pass therethrough, and the front panel 2 is glued or welded tightly onto the case 1. Also, the exit hole for the cable 4 is filled with resin according to a preferred method of manufacture.

The key pad, as described above, is attached or applied to the back face of a pane or any other non-magnetic panel, and each bulb can be actuated by a magnet placed on the front face of the pane directly in front of its mark. The command is sent to the coder/decoder 5 which can be located at a distance from the key pad. The key pad is thin (e.g. 5 mm), and has a small surface area of, for example, 5 $cm^2$ and thus, it can be easily placed, even if hidden, inside a building or in a piece of furniture.

The thickness of the pane (or of any other non-magnetic panel) is very different depending on its use, and the magnetic flux passing therethrough must travel a more or less long distance, spreading gradually outward. The effective surface of each opening can be adapted to this flux and, in fact, can be regulated as a function of the distance separating it from the magnetic key. This adaptation can be achieved by various methods. Technically, the easiest way is to remove the panel 2 and replace it on the outside with another panel having the same dimensions, but with the diameter of the openings being different. The original panel 2 can also be left in place, and another panel with the openings can be placed thereabove in the same places but with a smaller diameter.

The installer can have at his disposal a set of different panels with opening diameters which are different, depending on the type of panel, and he can select, at the time of mounting, the type of panel that is most appropriate to the distance provided between the bulb 9 and the magnet 21, either at the time when the panel 2 is replaced, or at the time when an extra panel is added.

While the invention has been particularly shown and described in reference to preferred embodiments thereof, it will be understood by those skilled in the art that changes in form and details may be made therein without departing from the spirit and scope of the invention.

I claim:

1. An electrical or electronic control key pad comprising:

a case;

a front panel mounted on the case, the front panel having a plurality of apertures passing therethrough, the front panel having a non-apertured portion for blocking magnetic flux from a magnet and having the plurality of apertures for allowing the magnetic flux from the magnet to pass therethrough;

a printed circuit on a base portion of the case; and a plurality of detector means connected to the printed circuit for detecting the magnetic flux passing through the apertures, the detector means each having a main body including blades which are sensitive to a magnetic field, each blade being extended by a pin, one portion of at least one of said pins being located under one of the plurality of apertures, while said main body and another portion of said pins located under the non-apertured portion of the front panel.

2. The key pad as set forth in claim 1, wherein said portion of the at least one of said pins placed under the aperture is curved around in a plane parallel to the front panel.

3. The key pad as set forth in claim 1, wherein a cable emerges laterally or through the back face of the case so as to connect it to a decoder located at a distance.

4. The key pad as set forth in claim 1, wherein the apertures of the front panel traverse lines parallel to and a short distance from the edges of the case, the axis of each pin running substantially through the center of the panel and the center of one opening.

5. The key pad as set forth in claim 1, wherein the apertures of the front panel are filled with a resin for enabling the magnetic field to pass through, and the front panel is tightly mounted onto the case, and the exit hole for the cable is filled with resin to thereby tightly seal the key pad so that the key pad can be immersed in fluid.

6. The key pad as set forth in claim 1, wherein the front panel has a label for enabling the apertures to be marked or numbered.

7. The key pad as set forth in claim 1, wherein the key pad is attachable to the back face of a panel or another non-magnetic panel, and wherein each detector means is actuable by a magnetic key placed on the front face of the panel directly on a corresponding mark on a label on the panel for marking or numbering the apertures.

8. The key pad as set forth in claim 1, wherein the surface of each of the apertures of the front panel can be adjusted depending on the distance thereof to the magnetic key by the replacement of the front panel with another front panel having apertures of smaller diameters.

9. The key pad as set forth in claim 1, wherein the thicknesses of the case and of the front panel make up the thickness of the key pad, wherein the thickness of the case is substantially equivalent to the thickness of the detector means.

* * * * *